United States Patent
Namba (10) Patent No.: US 7,360,366 B2
(45) Date of Patent: Apr. 22, 2008

(54) COOLING APPARATUS, EXPOSURE APPARATUS, AND DEVICE FABRICATION METHOD

(75) Inventor: Hisashi Namba, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 327 days.

(21) Appl. No.: 11/214,444

(22) Filed: Aug. 29, 2005

(65) Prior Publication Data

US 2006/0049367 A1     Mar. 9, 2006

(30) Foreign Application Priority Data

Sep. 3, 2004     (JP) .............................. 2004-257551

(51) Int. Cl.
*F25B 21/02* (2006.01)
(52) U.S. Cl. ........................................... 62/3.7
(58) Field of Classification Search .................. 62/3.7, 62/3.2–3.6; 355/30, 53, 67; 165/289, 904; 219/390, 444.1
See application file for complete search history.

(56) References Cited

U.S. PATENT DOCUMENTS 6,121,579 A * 9/2000 Aoki et al. ................. 219/390
6,126,744 A * 10/2000 Hawkins et al. ............... 117/85
6,259,072 B1 * 7/2001 Kinnard et al. ............. 219/486
6,992,306 B2 * 1/2006 Honda et al. ............ 250/492.2
7,191,599 B2 * 3/2007 Hara ............................ 62/3.7

FOREIGN PATENT DOCUMENTS

| JP | 2003-297719 | 10/2003 |
|---|---|---|
| JP | 2004-029314 | 1/2004 |
| JP | 2004-080025 | 3/2004 |

* cited by examiner

*Primary Examiner*—Kiet T. Nguyen
(74) *Attorney, Agent, or Firm*—Morgan & Finnegan, LLP (57) ABSTRACT

An apparatus for adjusting temperature of an object includes a heat radiation member, a deflection member to deflect heat radiation from the heat radiation member toward a region of the object, and an adjusting system to adjust temperature of the heat radiation member.

16 Claims, 10 Drawing Sheets

COOLING APPARATUS, EXPOSURE APPARATUS, AND DEVICE FABRICATION METHOD

BACKGROUND OF THE INVENTION

The present invention relates generally to a technique for adjusting temperature of an object, more particularly to a cooling apparatus for cooling an object such as an optical element in an exposure apparatus that exposes an object, such as a semiconductor wafer and a glass plate for a liquid crystal display ("LCD"), to light. The present invention is suitable, for example, for a cooling apparatus for cooling an object in an exposure apparatus that uses as exposure light ultraviolet ("UV") light and extreme ultraviolet ("EUV") light.

Reduction projection exposure apparatus have been conventionally employed which use a projection optical system to project a circuit pattern formed on a mask or a reticle onto a wafer, etc. to transfer the circuit pattern, in manufacturing such fine semiconductor devices as semiconductor memories and logic circuits in photolithography technology.

The minimum critical dimension ("CD") to be transferred by the projection exposure apparatus or resolution is proportionate to a wavelength of light used for exposure, and inversely proportionate to the numerical aperture ("NA") of the projection optical system. The shorter the wavelength is, the better the resolution is. Recent demands for finer semiconductor devices have promoted a shorter wavelength of ultraviolet light from an ultra-high pressure mercury lamp (i-line with a wavelength of approximately 365 nm) to KrF excimer laser (with a wavelength of approximately 248 nm) and ArF excimer laser (with a wavelength of approximately 193 nm).

However, the lithography using the ultraviolet light has the limit to satisfy the rapidly progressing fine processing of semiconductor devices, and an EUV exposure apparatus using EUV light with a wavelength of 10 to 15 nm shorter than that of the ultraviolet has been developed for efficient transfers of very fine circuit patterns.

In the wavelength range of the EUV light, an attenuation of energy by a gas is very large. Moreover, a carbon compound adheres to the optical element by a photochemical reaction of oxygen and impurities in the gas. Therefore, the exposure is executed in a vacuum environment.

On the other hand, since the EUV exposure apparatus is used to expose circuit patterns of 0.1 μm or smaller and required to meet very high critical dimension accuracy, only a deformation of about 0.1 nm or smaller is permissible on the optical element (in other words, the mirror surface). Deforms a shape of the optical element causes a deterioration of an optical performance, in particular, imaging performance. A mirror used for the EUV exposure apparatus does not reflect all the exposure light, but absorbs the exposure light of 30% or greater. Then, a temperature of the mirror rises gradually, and the surface shape of the mirror deforms. Therefore, it is necessary to cool the optical element. In other words, it is necessary to adjust the temperature of the optical element. However, because the EUV exposure apparatus exposes in the vacuum environment, the temperature adjustment is very difficult compared with the conventional. For example, the surface of the optical element can not be cooled by a convection in the vacuum environment. The temperature adjustment by supplying a cooling medium to a channel formed in the optical element generates a vibration, and a transfer position accuracy is deteriorated.

Then, it is thought to use a radiation (heat radiation) as cooling method of the optical element in the vacuum environment, in a non-contact manner. Concretely, a radiation board provides at a position opposite to a surface except an irradiation area irradiated to the exposure light on the optical element, and the heat is absorbed (radiation cooling) from the optical element through the radiation board. See, for example, Japanese Patent Applications, Publication Nos. 2004-80025 and 2004-29314.

When the radiation cooling is executed through the radiation board provided at the position opposite to the surface except the irradiation area on the optical element, the heat applied by the exposure light to the irradiation area moves to the surface of the optical element opposed to the radiation board, and is recovered. Therefore, a flow of the heat is generated in the optical element, and a temperature distribution is formed. The temperature distribution causes a heat distortion of the optical element and the deterioration of the optical performance. Especially, an exposure energy at unit time is enlarged to improve a throughput of the exposure apparatus, the temperature distribution is enlarged, and the optical performance is remarkably deteriorated.

If the radiation board provides at a position opposite to the irradiation area irradiated to the exposure light on the optical element, the irradiation area can be directly cooled, a heat quantity moved in the optical element decreases, and the temperature distribution generated in the optical element can be decreased. The irradiation area is located on an optical path of the exposure light, and the radiation board can not provide at the position opposite to the irradiation area.

BRIEF SUMMARY OF THE INVENTION

Accordingly, the present invention is directed to a technique that adjusts a temperature of an object while suppressing nonuniformity of temperature distribution in the object.

An apparatus of one aspect according to the present invention for adjusting temperature of an object, said apparatus includes a heat radiation member, a deflection member to deflect heat radiation from said heat radiation member toward a region of the object, and an adjustment system to adjust temperature of said heat radiation member.

A method of manufacturing a device according to another aspect of the present invention includes the steps of exposing a substrate to a pattern of radiant energy using the above apparatus, developing the exposure substrate, and processing the developed substrate to manufacture the device.

Other objects and further features of the present invention will become readily apparent from the following description of the preferred embodiments with reference to accompanying drawings.

DETAILED DESCRIPTION OF THE PREFERRED EMBODIMENTS

A description will now to be given of a cooling apparatus and exposure apparatus of one aspect according to the present invention. In each figure, the same reference numeral denotes the same element. Therefore, a duplicate description will be omitted. Here, FIG. 1 is a schematic sectional view of a cooling apparatus 1.

The cooling apparatus 1 is to cool an optical element OE in a vacuum or reduced pressure environment, in a non-contact manner. The optical element OE accommodates, for example, a chamber with the vacuum or reduced pressure environment. A vacuum pump (not shown) maintains the chamber to be high vacuum, for example, about $1 \times 10^{-6}$ [Pa] by so that a reaction between the residual gas component in the exposure optical path, such as polymer organic gas, and a light L may not contaminate the optical element OE's surface and lower its transmittance and reflectance.

The optical element OE includes an irradiation area IA irradiated to the light L, and images the light L using reflection, refraction, diffraction, etc. The optical element OE includes, for example, a mirror, a lens, a parallel plate glass, a prism, and a Fresnel zone plate, a kinoform, a binary optics, a hologram, and other diffraction optical elements. The instant embodiment describes the optical element OE as a mirror.

Figure 1:
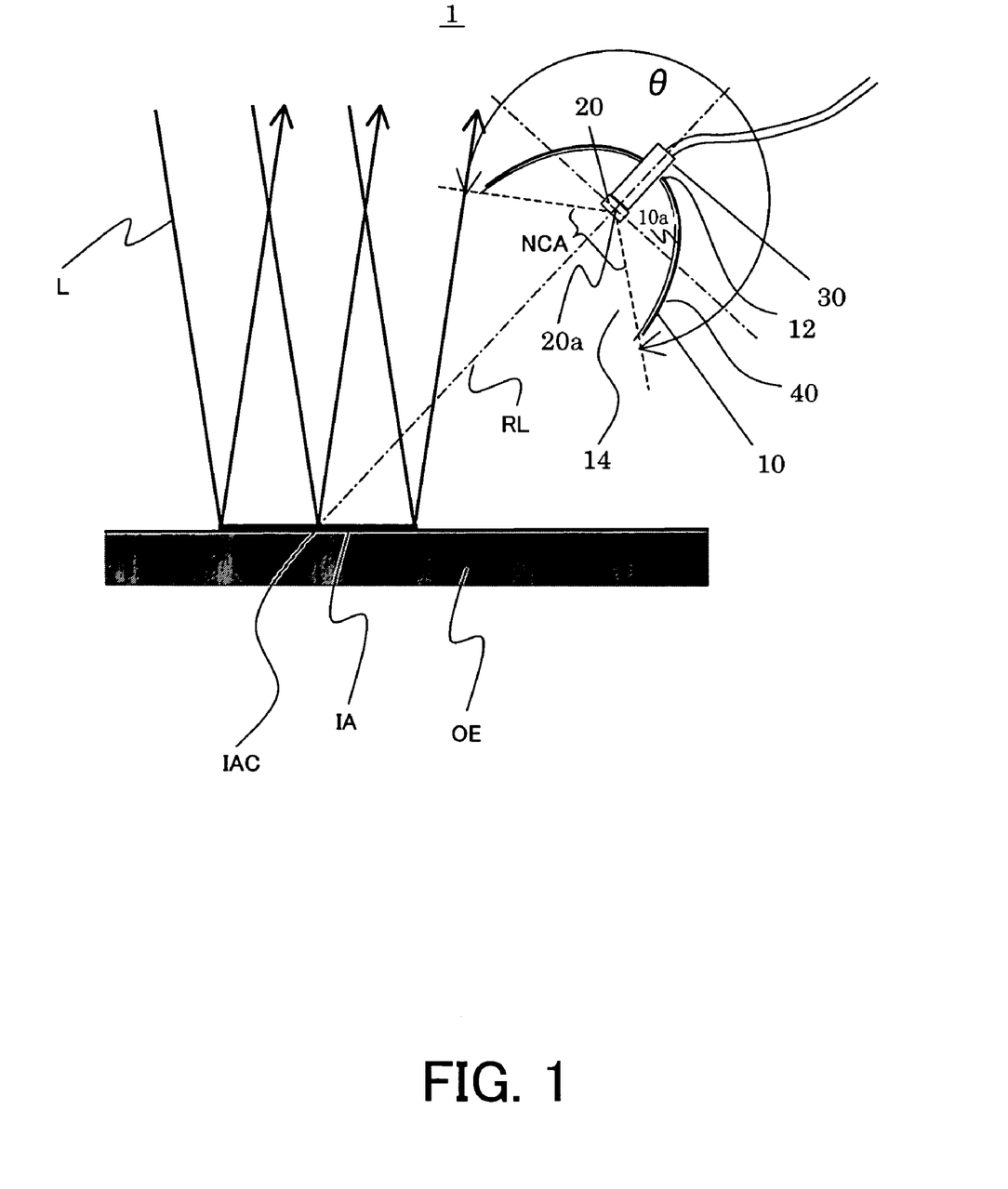
FIG. 1 is a schematic sectional view of a cooling apparatus of one aspect according to the present invention.

The cooling apparatus includes, as shown in FIG. 1, a concave mirror 10, a radiation cooling source (radiation board or radiation member) 20, a cooling mechanism 30, and a temperature adjustment mechanism 40.

The concave mirror 10 condenses a radiation energy (a kind of electromagnetic wave) from the irradiation area IA of the optical element OE. The radiation is a phenomenon that a part of an energy of material is discharged in the electromagnetic wave form or absorbs the electromagnetic wave and is excited. The radiation energy E discharged from the material of a black body with temperature of T is shown by $E [W/m^2] = \sigma T^4$, where $\sigma$ is a Stefan-Boltzmann factor.

The concave mirror 10 has a surface shape of a paraboloid (the radiation cooling preferably provides at a focus position or the neighborhood, in other words, a position that a distance from the focus is 10% or less of focal length, for the paraboloid) or a spheroid (the radiation cooling source preferably provides at one focus position, and the irradiation area of the optical element preferably provides at the other focus position). The instant embodiment uses a paraboloid mirror as the concave mirror 10. The paraboloid mirror is arranged so that a center IAC of the irradiation area IA of the optical element OE may exist on an extension line RL of the rotation axis. In other words, the concave mirror 10 is arranged as the rotation axis intersects with the center IAC of the irradiation area IA. However, the concave mirror 10 does not intercept the light L, in other words, is arranged at positions except the optical path of light L.

The concave mirror 10 is arranged on an opposite side of the irradiation area IA of the optical element OE for the radiation cooling source 20 described later as shown in FIG. 1, and has a visual angle θ of 160° or more to the concave mirror 10 from the radiation cooling source 20. Here, the visual angle θ to the concave mirror 10 from the radiation cooling source 20 is defined. The center of the radiation cooling source 20 (a barycenter in the radiation cooling source is desirable) is considered to be a center of the angle (vertex). It thinks about a section of the concave mirror 10 in a plane surface including a straight line that connects the center IAC of the irradiation area IA of the optical element OE with the center of the radiation cooling source 20. In the section, the center of the radiation cooling source 20 is considered to be the vertex of the angle, and the angle formed by one opening edge of the concave mirror 10, the center of the radiation cooling source 20, and the other opening edge of the concave mirror 10 is defined as the visual angle θ. A surface on the optical element OE side of the radiation cooling source 20 is given to processing to lower the radiation rate. On the other hands, a surface on the concave mirror 10 has higher radiation rate. Therefore, the concave mirror 10 side of the radiation cooling source 10 should cover with the concave mirror to prevent a thermal influence to a periphery environment. The higher radiation rate surface of the radiation cooling source 20 consists of a glass or ceramic. These insulators discharge a lot of radiation energy in a normal direction of the surface. On the other hand, considerably little radiation energy is discharged in a direction along the surface compared with the normal direction. Thereby, if the visual angle θ to the concave mirror 10 from the radiation cooling source 20 is 160° or more, the thermal influence that the surface on the concave mirror side of the radiation cooling source 20 exerts to the periphery environment can be decreased.

The concave mirror 10 has a surface 10a processed by mirror processing, and a mirror reflectivity for the radiation energy from the irradiation area IA of the optical element OE of 0.7 or more. A lot of radiation energy from the irradiation IA of the optical element OE can reach the radiation cooling source 20 by having higher mirror reflectivity. Therefore, a capacity to cool the irradiation area IA of the optical element OE increases. On the other hand, when an influence of a diffuse reflection of the concave mirror is large, the radiation energy from the irradiation area IA of the optical element OE diffuses by the concave mirror. Then, a ratio of the radiation energy that reaches the radiation cooling source becomes small, and a cooling amount becomes small.

The surface 10a of the concave mirror 10 is composed of a material with a low radiation rate such as gold, silver, and aluminum. The concave mirror 10 has an installation part 12 to install the cooling mechanism 30 (in the instant embodiment, a cryo-pumps head) described later in the vertex of the paraboloid. The installation part 12 B is composed as a penetration hole that cuts a part of the vertex neighborhood of the concave mirror 10.

The radiation cooling source 20 is arranged at the focus of the concave mirror 10, and cools the irradiation area IA of the optical element OE by the radiation. When there are a first member and a second member, the radiation energy (radiation heat) is transmitted to the first member from the second member, and he radiation energy is transmitted to the second member from the first member. As a result of the transfer, between such two members of the radiation energy, the radiation heat transfer is to be cooled one side while other member is heated as for the difference of two radiation energy (radiation heat transfer amount). In the instant embodiment, it is expressed that one side gives the other side the radiation energy (even heating and cooling) to easily express heating and cooling by the transfer of the radiation energy. The radiation cooling source 20 does not intercept the light L, in other words, is arranged at positions except the optical path of light L similar to the concave mirror 10.

Figure 2:
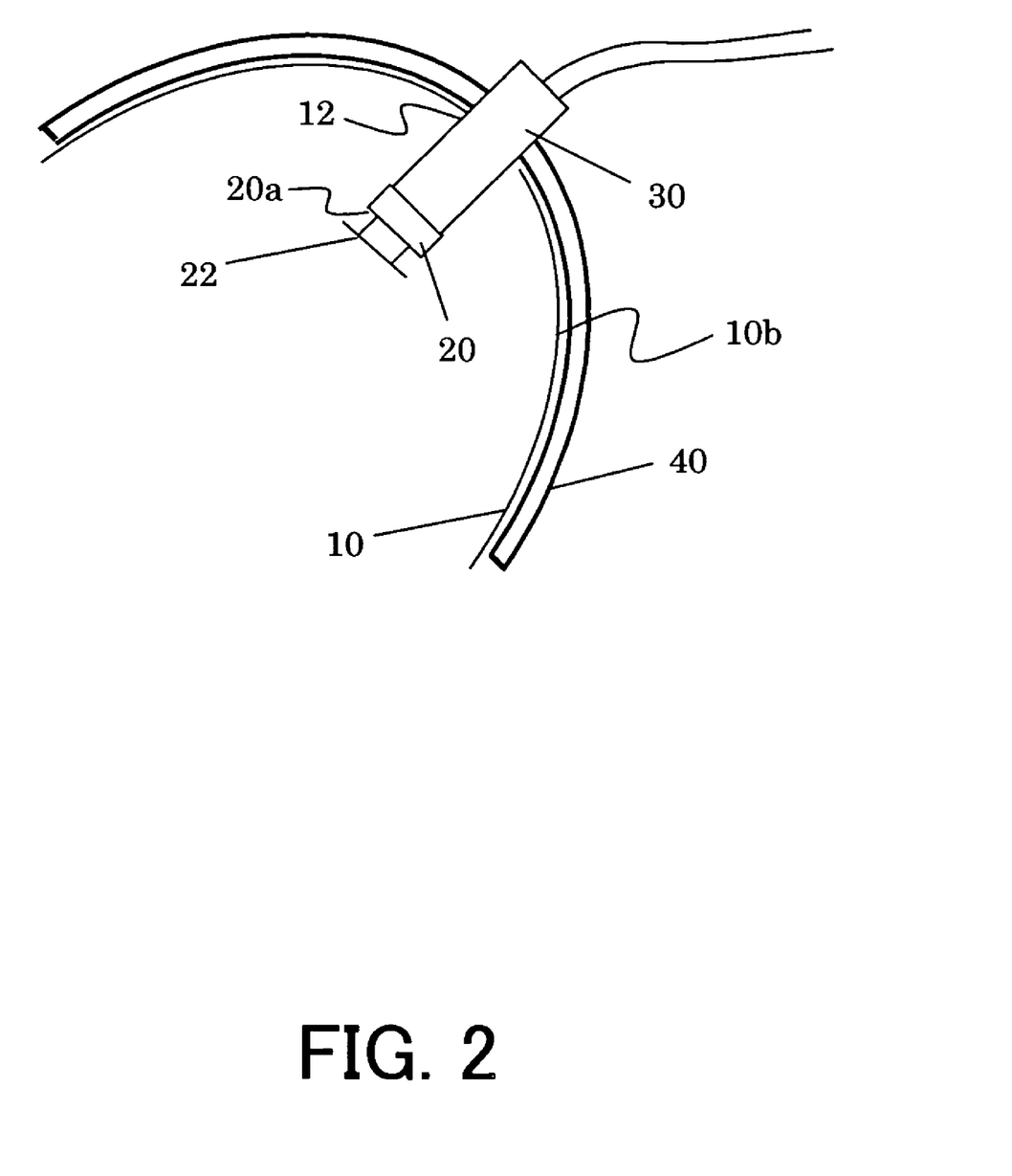
FIG. 2 is a partially enlarged sectional view of the cooling apparatus (a concave mirror and radiation cooling source) shown in FIG. 1.

A surface of the radiation cooling source 20 is composed of a material with the radiation rate of 0.6 or more (for example, ceramic (alumina and SiC, etc.) and glass, etc., more preferably a material with the radiation rate of 0.7 or more). A surface 20a of the radiation cooling source 20 opposed to the optical element OE is composed of a material with a low radiation rate (the radiation rate is 0.2 or less, more preferably 0.15 or less), and has a board or film a metal (such as gold, silver, aluminum) on the surface. Moreover, a shielding board 22 composed of the material with a low radiation rate may be arranged at the surface 20a of the radiation cooling source 20 as shown in FIG. 2. The shielding board 22 uses gold, silver, aluminum etc. Here, FIG. 2 is a partially enlarged sectional view of the cooling apparatus 10 (the concave mirror 10 and the radiation cooling source 20).

The cooling mechanism 30 cools the radiation cooling source 20, and is a cryo-pumps in the instant embodiment. The cooling mechanism 30 cools the radiation cooling source 20 so that the temperature of the radiation cooling source 20 may become −100° C. or less. The cooling mechanism 30 may cool the radiation cooling source 20 by supplying the cooling medium such as a liquid nitrogen and liquid helium in the radiation cooling source 20. However, in this case, it is necessary to give a heat insulation processing to a pipe that introduces the cooling medium to the radiation cooling source 20 or adjust the temperature to be the same temperature as an environmental temperature.

The temperature adjustment mechanism 40 is arranged at a back surface 10b of the concave mirror 10 as shown in FIG. 2, and adjusts the temperature of the concave mirror 10. The temperature adjustment mechanism 40 prevents, in the instant embodiment, a temperature decrease of that originates in influence of radiation cooling source 20 by supplying a medium such as water, air, and nitrogen, and maintains the temperature of the concave mirror 10 to the same temperature as the environmental temperature.

Here, a description will be given of a flow of the radiation energy from the irradiation area IA of the optical element OE and an arrangement relationship between the concave mirror 10 and the radiation cooling source 20. A ray from the center position of the radiation cooling source 20 is assumed, and a ray that reaches the concave mirror 10 is considered among these rays.

Figure 10:
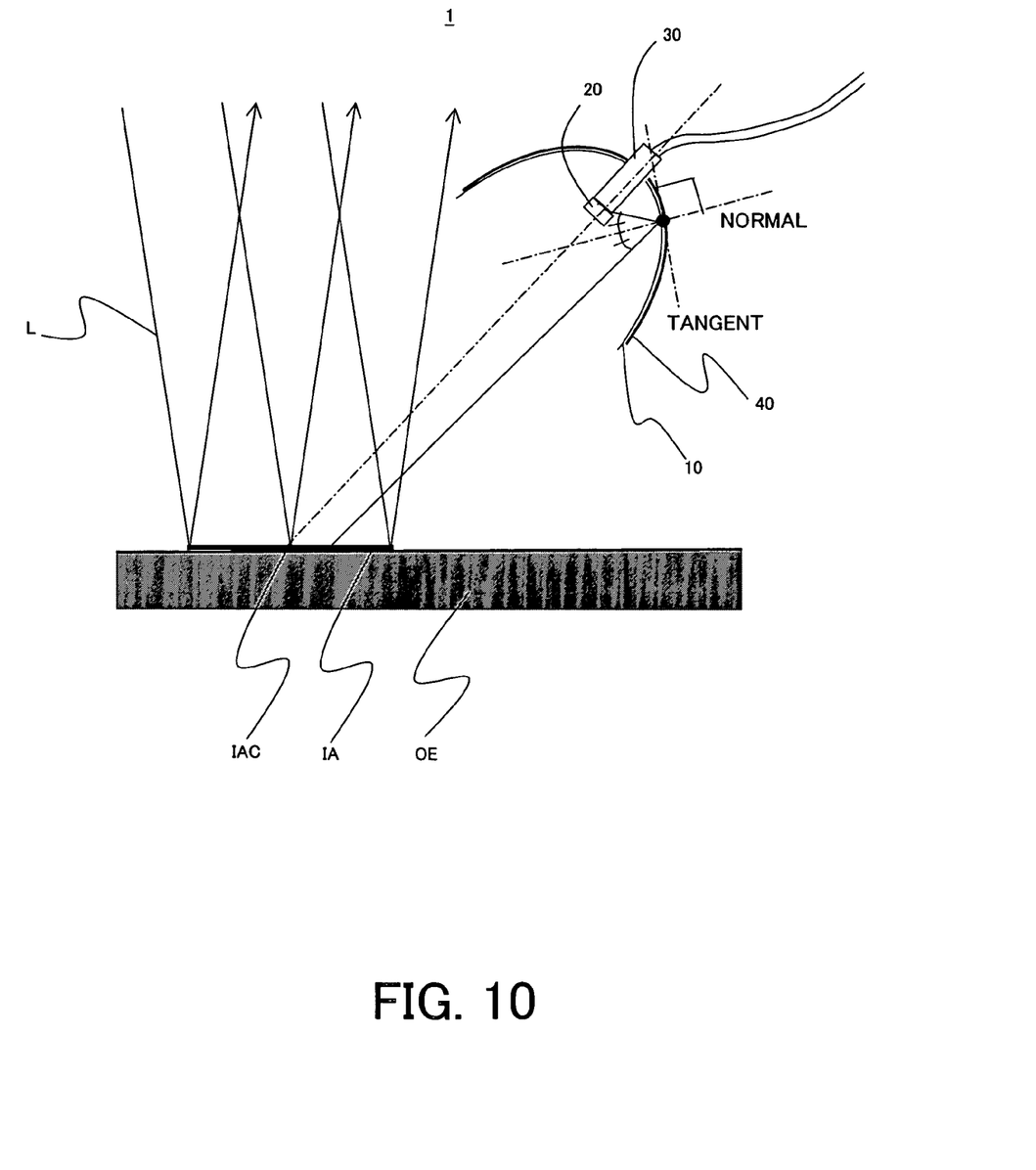
FIG. 10 is a view for explaining an arrangement of a cooling apparatus to efficiently cool an optical element.

The majority of ray (electromagnetic wave) that reaches the concave mirror 10 from the radiation cooling source 20 mirror-reflects at the concave mirror 10. In the mirror reflection, the normal at the reflection position becomes a bisector of the incident ray and reflected ray. Therefore, when the concave mirror 10 of the instant embodiment is used, the ray reflected from the concave mirror 10 is irradiated on the irradiation area IA of the optical element OE. As a result, the radiation cooling source 20 heat exchanges only the irradiation area IA through the concave mirror 10. In other words, to cool the irradiation area IA of the optical element OE efficiently, it composes as shown in FIG. 10. A straight line that connects an arbitrary point on the irradiation area IA of the optical element OE with a predetermined point on the concave mirror 10 corresponding to the arbitrary point is considered. Moreover, a straight line that connects the predetermined point and the radiation cooling source 20 is considered. A bisector of an angle formed by two straight lines may be substantially corresponding to a normal of the concave mirror 10 in the predetermined point on the concave mirror 10. Moreover, it is possible to reword as follows. A plane surface formed by the arbitrary point on the irradiation area IA of the optical element OE, the predetermined point on the concave mirror 10 corresponding to the arbitrary point, and the radiation cooling source 20 (a predetermined in the radiation cooling source 20) is considered. Moreover, in the plane surface, a straight line that connects the arbitrary point on the irradiation area IA of the optical element OE with the predetermined point on the reflection surface of the concave mirror 10 is considered. The concave mirror is composed so that an angle formed by the straight line and a normal in the predetermined point to the reflection surface of the concave mirror 10 and an angle formed by the predetermined point and the radiation cooling source 20 may substantially become the same. Here, FIG. 10 is a view for explaining an arrangement of the cooling apparatus 1 to efficiently cool the optical element OE.

Figure 3:
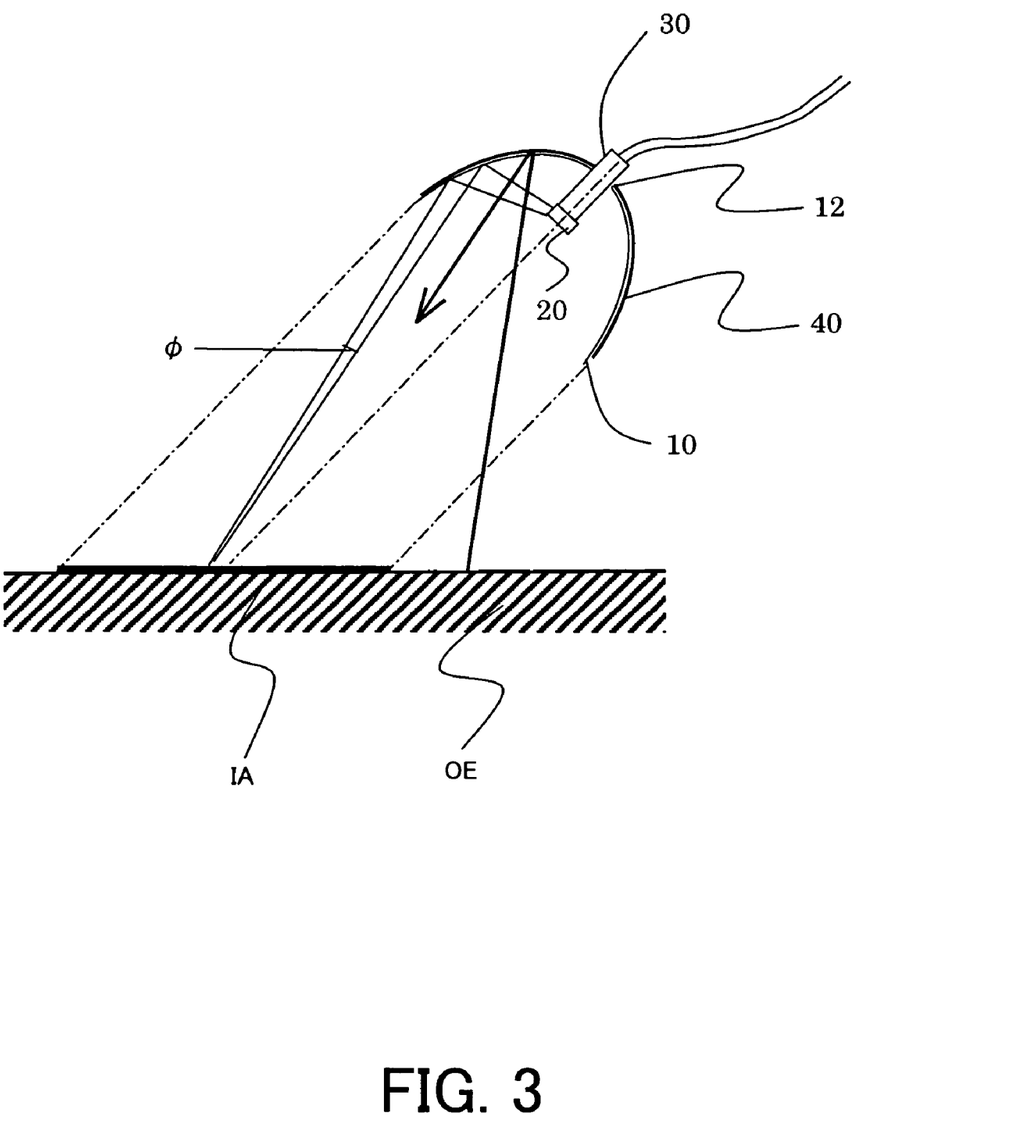
FIG. 3 is a view for explaining a radiation energy radiated from arbitrary point in an irradiation area of an optical element shown in FIG. 1.

However, in the above description, the radiation cooling source 20 is considered to be a point, and when a surface area of the radiation cooling source 20 is 0, the radiation transfer heat amount becomes 0. Actually, as shown in FIG. 3, in the arbitrary point on the irradiation area IA of the optical element OE, the radiation energy radiated in a certain solid angle φ reflects at the concave mirror 10, and reaches the radiation cooling source 20. If the solid angle φ is considered as a form factor, the cooling capacity improves as the radiation cooling source 20 enlarges. However, even if the radiation cooling source 20 is arranged at the focus of the concave mirror 10, the surface of the radiation cooling source 20 exists at a position apart from the focus of the concave mirror 10. Therefore, in an optical expression, a cooled area becomes an unclear state, in other words, the cooled area is enlarged more than an ideality cooling state (the radiation cooling source 20 is considered to be the point). Thereby, the cooling capacity of the cooling apparatus 1 and a degree limited to the cooled area are relation ship of trade-off. Here, FIG. 3 is a view for explaining the radiation energy radiated from arbitrary point in the irradiation area IA of the optical element OE.

If a size of the radiation cooling source 20 is 5% to 20% for a size of the opening part 14 of the concave mirror 10, the cooled area can be limited, and the cooling capacity to achieve the effect of cooling the irradiation area IA of the optical element OE can be obtained. However, even if the size of the radiation cooling source 20 is 20% or more for the size of the opening part 14 of the concave mirror 10, the cooled area can be limited to some degree.

Hereinbefore, the radiation energy reflected from the concave mirror 10 was considered. Hereafter, a radiation energy that directly reaches the radiation cooling source 20 among the radiation energy radiated from the plane including the irradiation area IA of the optical element OE is considered. An area NCA of the radiation cooling source 20 not covered with the concave mirror 10, in other words, a plane 20a opposed to the irradiation area IA of the optical element OE can be seen from most positions of the plane including the irradiation area IA of the optical element OE. Therefore, as the above-mentioned, the area NCA of the radiation cooling source 20 not covered with the concave mirror 10 is composed of the material with a low radiation rate, or is covered with a cover with a low radiation rate.

Therefore, the radiation energy that directly reaches the radiation cooling source 20 (in other words, a heat transfer amount to the radiation cooling source 20) among the radiation energy radiated from the plane including the irradiation area IA of the optical element OE decreases. Thereby, the cooling amounts in the area except the irradiation area IA can be decreased.

Thus, the cooling apparatus 1 can directly cool the irradiation area IA irradiated to the light L, in the non-contact manner. Moreover, the cooling apparatus 1 can improve the temperature distribution of the optical element OE that causes the deterioration of the imaging performance. In other words, the cooling apparatus 1 prevents a temperature gradient being formed on the optical element OE. Therefore, the optical element OE cooled by the cooling apparatus 1 can provide a superior optical performance.

Figure 4:
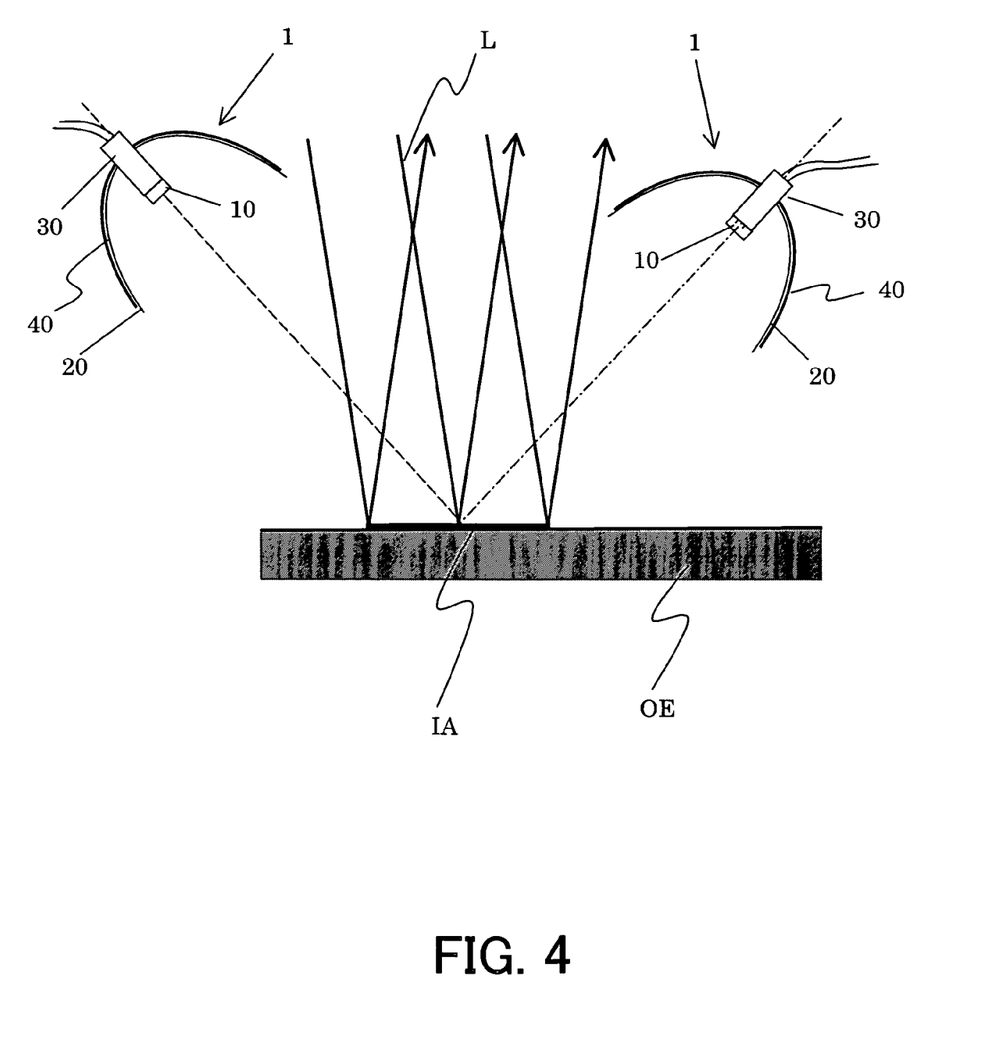
FIG. 4 is a schematic sectional view of one example of arrangement when one optical element is cooled by using plural cooling apparatus.

Thus, the cooling capacity of the cooling apparatus 1 is limited. Then, one (irradiation area IA of) optical element OE may be cooled by using plural cooling apparatus 1. Therefore, the cooling capacity can be increased. A large cooling amount can be obtained by using plural cooling apparatus 1, and the temperature gradient on the optical element OE can be decreased. Here, FIG. 4 is a schematic sectional view of one example of arrangement when one optical element OE is cooled by using plural cooling apparatus 1.

The majority of a heat load given to the optical element OE is caused by the absorption of the light L. For example, in the present EUV exposure apparatus, the reflectivity of a reflection film to reflect the EUV light is 70% or less, and the mirror (optical element OE) absorbs about 30% of the irradiated EUV light. Before the EUV exposure apparatus operates (before the exposure), the EUV light is not irradiated to the mirror, and the heat load given to the mirror is 0. When the exposure is start, the EUV is irradiated to the mirror, and the heat load is given to the mirror. When the exposure of one wafer ends, the irradiation of the EUV light stops to exchange wafers. When the exchange of wafers ends, the EUV light is irradiated again, and the heat load is given to the mirror.

Therefore, the cooling apparatus should have an enough response for the heat load given to the mirror and execute the radiation cooling. This is because a temperature change of the mirror increases if the mirror is cooled when the light is not irradiated to the mirror (in other words, the heat load is not given to the mirror). However, the cooling apparatus 1 lowers the radiation cooling source 20 to a very low temperature, and can not make the radiation cooling follow the heat load given to the mirror (for example, cannot switch turning on and turning off of the radiation cooling at high speed).

Figure 5:
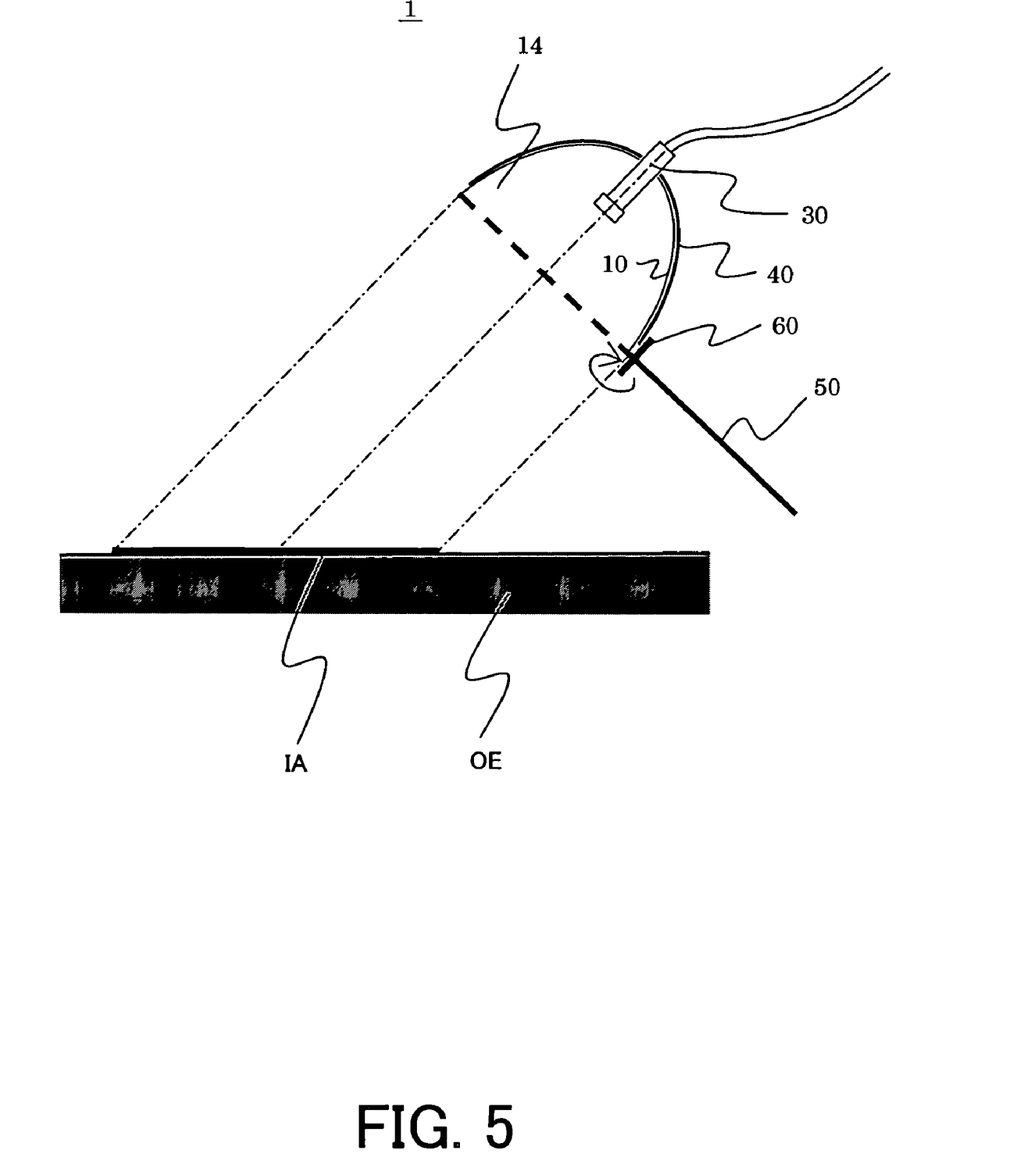
FIG. 5 is a schematic sectional view of a cooling apparatus of one aspect according to the present invention.

Then, a shutter 50 that intercepts between the irradiation area IA of the optical element OE and the radiation cooling source 20 is arranged as shown in FIG. 5. The opening and shutting of the shutter 50 switches the execution of the radiation cooling and non-execution of the radiation cooling to the irradiation area IA. The shutter 50 has a size that can be covered at least the radiation cooling source 20, and preferably has a size that can be covered the opening part 14 of the concave mirror 10. Here, FIG. 5 is a schematic sectional view of the cooling apparatus 1.

The shutter 50 includes a driving control mechanism 60 that controls the opening and shutting (drive) of the shutter 50. The driving control mechanism 60 opens the shutter 50 while the light L is irradiated to the optical element OE, and shuts the shutter 50 while the light L is not irradiated to the optical element OE. In other words, the driving control mechanism 60 controls the opening and shutting of the shutter 50 according to the irradiation and non-irradiation of the light L to the optical element OE. The driving control mechanism 60 is accessed to a computer that has an exposure data (an information of a timing that the irradiation and non-irradiation of the exposure light are switched) or has the exposure data. The driving control mechanism 60 controls the timing of the opening and shutting of the shutter 50 based on the exposure data.

The cooling apparatus 1 can make responded the radiation cooling follow according to the irradiation state of the light L to the optical element OE by the shutter 50 and driving control mechanism 60. The cooling apparatus 1 switches, for example, on and off of the radiation cooling. Therefore, the temperature change of the optical element OE can be suppressed.

Figure 6:
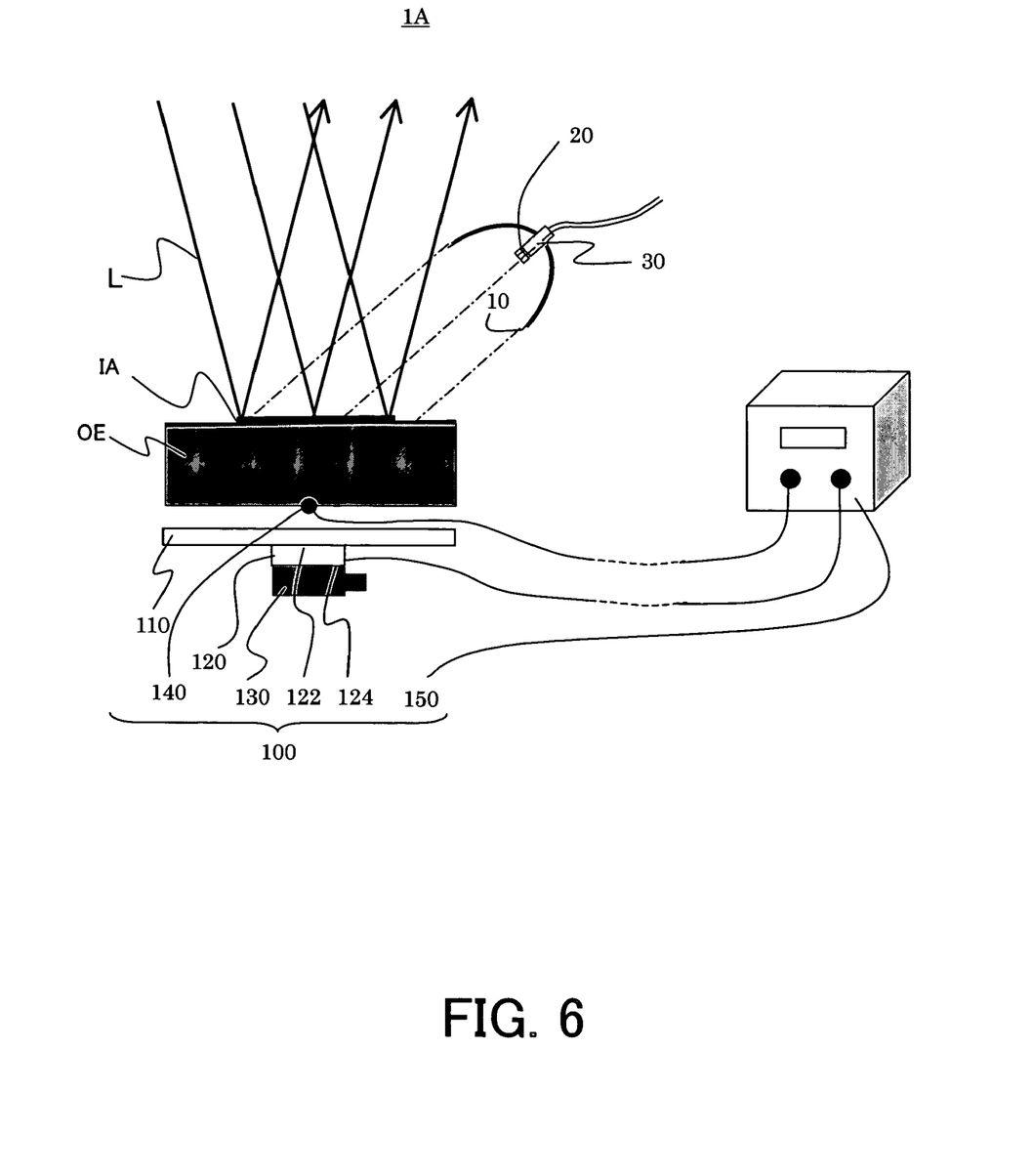
FIG. 6 is a schematic sectional view of a cooling apparatus as a variation of the cooling apparatus shown in FIG. 1.

Referring to FIG. 6, a description will be given of a cooling apparatus 1A as a variation of the cooling apparatus 1. The cooling apparatus 1A has a structure combined the cooling apparatus 1 and a cooling apparatus that is proposed by the instant assignee in Japanese Patent Application, Publication No. 2004-80025. Here, FIG. 6 is a schematic sectional view of the cooling apparatus 1A as a variation of the cooling apparatus 1.

The cooling apparatus 1A includes, as shown in FIG. 6, the radiation cooling source 20, the cooling mechanism 30, the temperature adjustment mechanism 40, a radiation cooling mechanism 100.

The radiation cooling mechanism 100 is provided at a position that dose not intercept the light L (in other words, except the optical path of light L) and apart from the optical element OE, and absorbs the heat from the optical element OE through the radiation. The radiation cooling mechanism 100 includes a radiation plate 110, a Peltier element 120, a heat release block 130, a detector 140, a controller 150.

The radiation plate 110 is fixed apart by a predetermined interval from the optical element OE through a support member (not shown). The radiation plate 110 is cooled by a Peltier effect of the Peltier element 120 described later, and becoming at a low temperature to the optical element OE. In other words, the radiation plate 110 absorbs the heat from the optical element OE due to the temperature difference from the optical element OE.

The Peltier element 120 arranges, for example, a p-type semiconductor and a n-type semiconductor thermally parallel to each other. The Peltier element 120 is controlled by the controller 150 described later, and coupled with the radiation plate 110 to cool the radiation plate 110 using the Peltier effect. Concretely, a joint of a heat absorption surface 122 of the Peltier element 120 with the radiation plate 110 would absorb the heat from the radiation plate 110 and cool the radiation plate 110. The heat value which the Peltier element 120 may absorb is adjustable by applied voltage. The heat release block 130 is coupled with the heat radiation surface 124 of the Peltier element 120.

The heat release block 130 includes a channel (not shown) for the cooling medium to flow through. The channel is formed over the entire surface in the heat release block 130, and enables the cooling medium to flow through the entire surface in the heat release 130. The heat release block 130 collects the heat from the optical element OE absorbed via the radiation plate 110, which is cooled by the cooling medium and exhausted from the heat radiation surface 124 of the Peltier element 120.

The detector 140 is attached to the optical element OE outside the irradiation area IA, and detects the temperature of the optical element OE. The detector 140 includes a temperature sensor, such as a thermocouple, a resistor temperature sensor, and an infrared temperature sensor, and sends the detected temperature of the optical element OE to the controller 150.

The controller 150 controls the radiation cooling mechanism 100 so that the temperature of the optical element OE detected by the detector 140 may have the constant value. More specifically, the controller 150 controls the temperature of the radiation plate 110 by changing the voltage applied to the Peltier element 120.

The cooling apparatus 1 can make responded the radiation cooling follow according to the heat load given to the optical element OE by the shutter 50 and driving control mechanism 60. However, the cooling apparatus 1 can not control the temperature of the optical element OE for small disturbance. Then, the cooling apparatus 1A can decreases the temperature gradient of the entire optical element OE and maintains the temperature of the optical element OE to constant by applying the radiation cooling mechanism 100.

Figure 7:
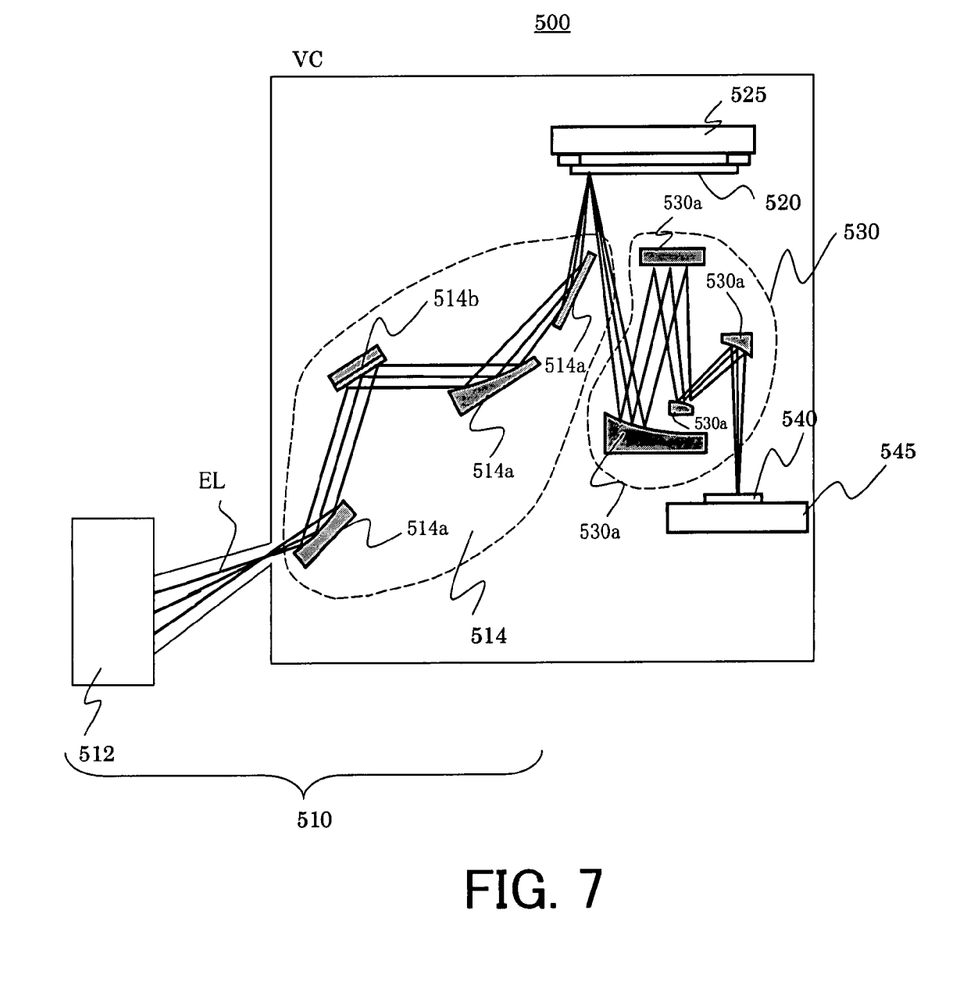
FIG. 7 is a schematic sectional view of an exposure apparatus of one aspect according to the present invention.

Referring now to FIG. 7, a description will be given of an exemplary inventive exposure apparatus 500 that applies the cooling apparatus 1 or 1A of the present invention. Here, FIG. 7 is a schematic sectional view of the exposure apparatus 500 of the present invention.

The exposure apparatus 500 is a projection exposure apparatus that uses, as illumination light for exposure, EUV light EL (with a wavelength of, e.g., 13.4 nm). The exposure apparatus 500 exposes a circuit pattern formed on a mask 520 onto an object 540. This exposure apparatus 500 is suitable for a lithography process less than submicron or quarter micron, and the present embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

Referring to FIG. 7, the exposure apparatus 500 includes an illumination apparatus 510, a mask stage 525 that mounts the mask 520, a projection optical system 530, and a wafer stage 545 that mounts the object 540.

A vacuum chamber VC is installed at least an optical path through which EUV light EL passes to maintain the vacuum environment as shown in FIG. 7. This is because the transmittance of the EUV light EL to the atmosphere is low, and the EUV light EL generates a contaminant through a reaction with residual gas, such as polymer organic gas.

The illumination apparatus 510 uses arc-shaped EUV light, for example, with a wavelength of 13.4 corresponding to an arc-shaped field of the projection optical system 530 to illuminate the mask 520, and includes an EUV light source 512 and illumination optical system 514.

The EUV light source 512 employs, for example, a laser plasma light source. It generates high temperature plasma by irradiating a pulsed laser beam with high intensity onto a target material in a vacuum chamber, and uses the EUV light, for example, with a wavelength of about 13 nm, which has been emitted from the plasma. The target material may use a metallic thin film, an inert gas, a liquid-drop, etc., and the target supply unit may use a gas jet and so on. The pulse laser is usually driven with a higher repetitive frequency, such as several kHz, for increased average intensity of radiated EUV light.

The illumination optical system 514 includes a condenser mirror 514a, and an optical integrator 514b. The condenser mirror 514a serves to collect the EUV light that is isotropically irradiated from the laser plasma. The optical integrator 514b serves to uniformly illuminate the mask 520 with a predetermined NA. The illumination optical system 514 further may include an aperture to limit the illumination area to an arc shape at a position conjugate with the mask 520. An optical element in the illumination optical system 514 such as the condenser mirror 514a and optical integrator 514b may apply any one of the inventive cooling apparatuses 1 and 1A. Therefore, the temperature distribution on the optical element improves, and the superior imaging performance can be provided.

The mask 520 is a reflection mask that forms a circuit pattern or image to be transferred, and supported and driven by the mask stage 525. The diffracted light from the mask 520 is reflected by the projection optical system 530 and projected onto the object 540. The mask 520 and the object 540 are arranged optically conjugate with each other. The exposure apparatus 500 is a step-and-scan exposure apparatus, and projects a reduced size of the pattern on the mask 520 on the object 540 by scanning the mask 520 and the object 540.

The mask stage 525 supports the mask 520 and is connected to a moving mechanism (not shown). The mask stage 525 may use any structure known in the art. A moving mechanism (not shown) may include a linear motor etc., and drives the mask stage 525 at least in a direction X and moves the mask 520. The exposure apparatus 500 assigns the direction X to scan the mask 520 or the object 540, a direction Y perpendicular to the direction X, and a direction Z perpendicular to the mask 520 or the object 540.

The projection optical system 530 uses plural multilayer mirrors 530a to project a reduced size of a pattern formed on the mask 520 onto the object 540. The number of mirrors 530a is about four to six. For wide exposure area with the small number of mirrors, the mask 520 and object 540 are simultaneously scanned to transfer a wide area that is an arc-shaped area or ring field apart from the optical axis by a predetermined distance. The projection optical system 530 has a NA of about 0.2 to 0.3. An optical element in the projection optical system 530 such as the mirror 530a may apply any one of the inventive cooling apparatuses 1 and 1A. Therefore, the temperature distribution on the optical element improves, and the superior imaging performance can be provided.

The instant embodiment uses a semiconductor wafer as the object to be exposed 540, but it may include a spherical semiconductor and liquid crystal plate and a wide range of other objects to be exposed. Photoresist is applied onto the object 540.

The object to be exposed 540 is held onto the wafer stage 545 by a wafer chuck. The wafer stage 545 moves the object 540, for example, using a linear stage in XYZ directions. The mask 520 and the object 540 are synchronously scanned. The positions of the mask stage 525 and wafer stage 545 are monitored, for example, by a laser interferometer, and driven at a constant speed ratio.

In exposure, the EUV light EL emitted from the illumination apparatus 510 illuminates the mask 520, and images a pattern formed on the mask 520 onto the object 540 surface. The instant embodiment uses an arc or ring shaped image plane, scans the mask 520 and object 540 at a speed ratio corresponding to a reduction ratio to transfer the entire pattern surface of the mask 520.

As the optical performance is sensitive to a surface shape of the optical element in the projection optical system in the exposure apparatus, the inventive cooling apparatus 1 or 1A preferably is used for an optical element in the projection optical system. In particular, the inventive cooling apparatus 1 or 1A preferably uses for an optical element near the mask that receives much light intensity. Of course, it may be used for the illumination optical system. In particular, the optical element closest to a light source receives a large amount of light among the optical elements, and generates the large absorbed heat value inevitably. Then, the temperature gradient formed by the absorbed heat increases. The inventive cooling apparatus decreases the temperature rise by absorbing a large amount of the light and the temperature gradient formed on the optical element, and can decrease the heat distortion of the optical element.

Figure 8:
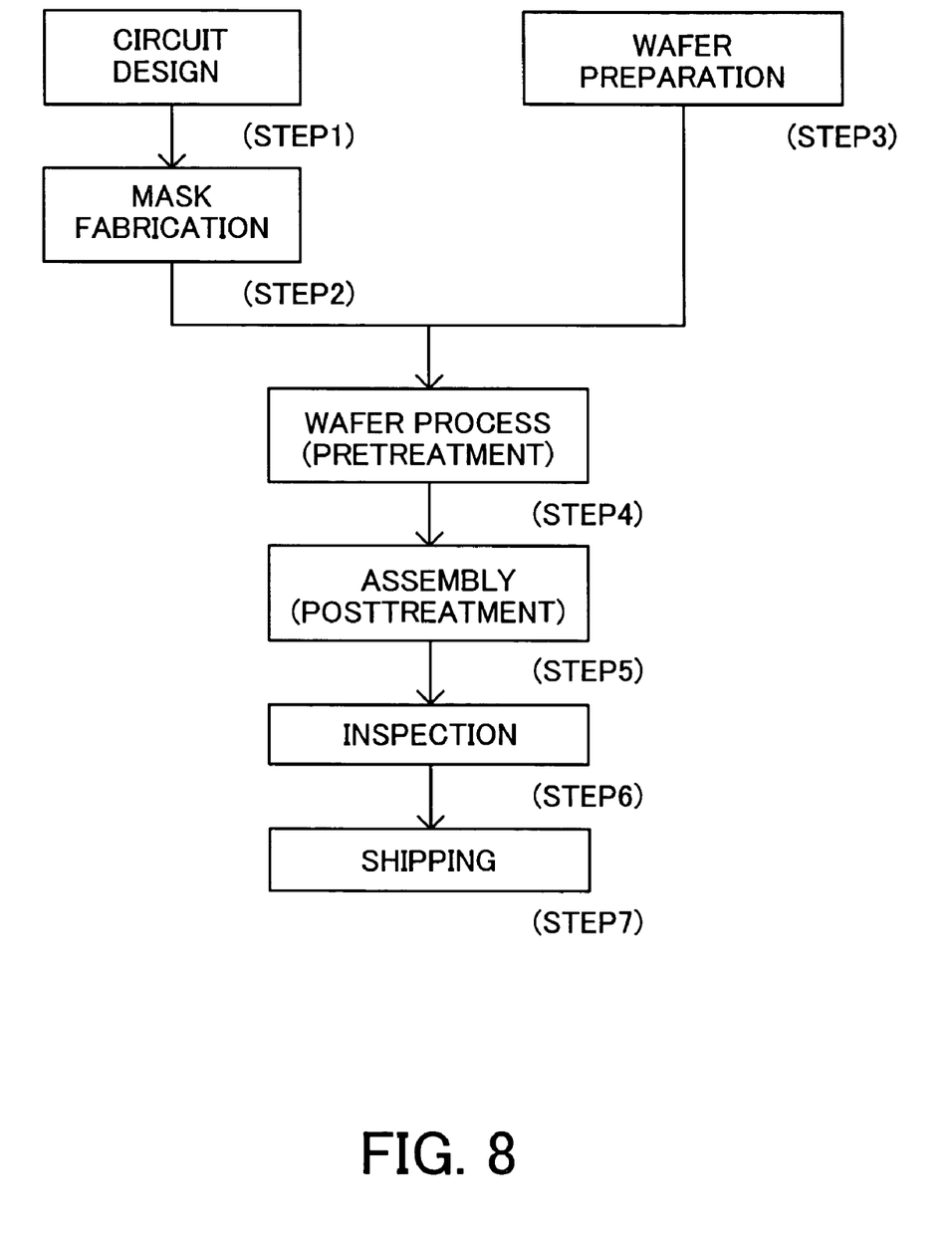
FIG. 8 is a flowchart for explaining how to fabricate devices (such as semiconductor chips such as ICs, LCDs, CCDs, and the like).
Figure 9:
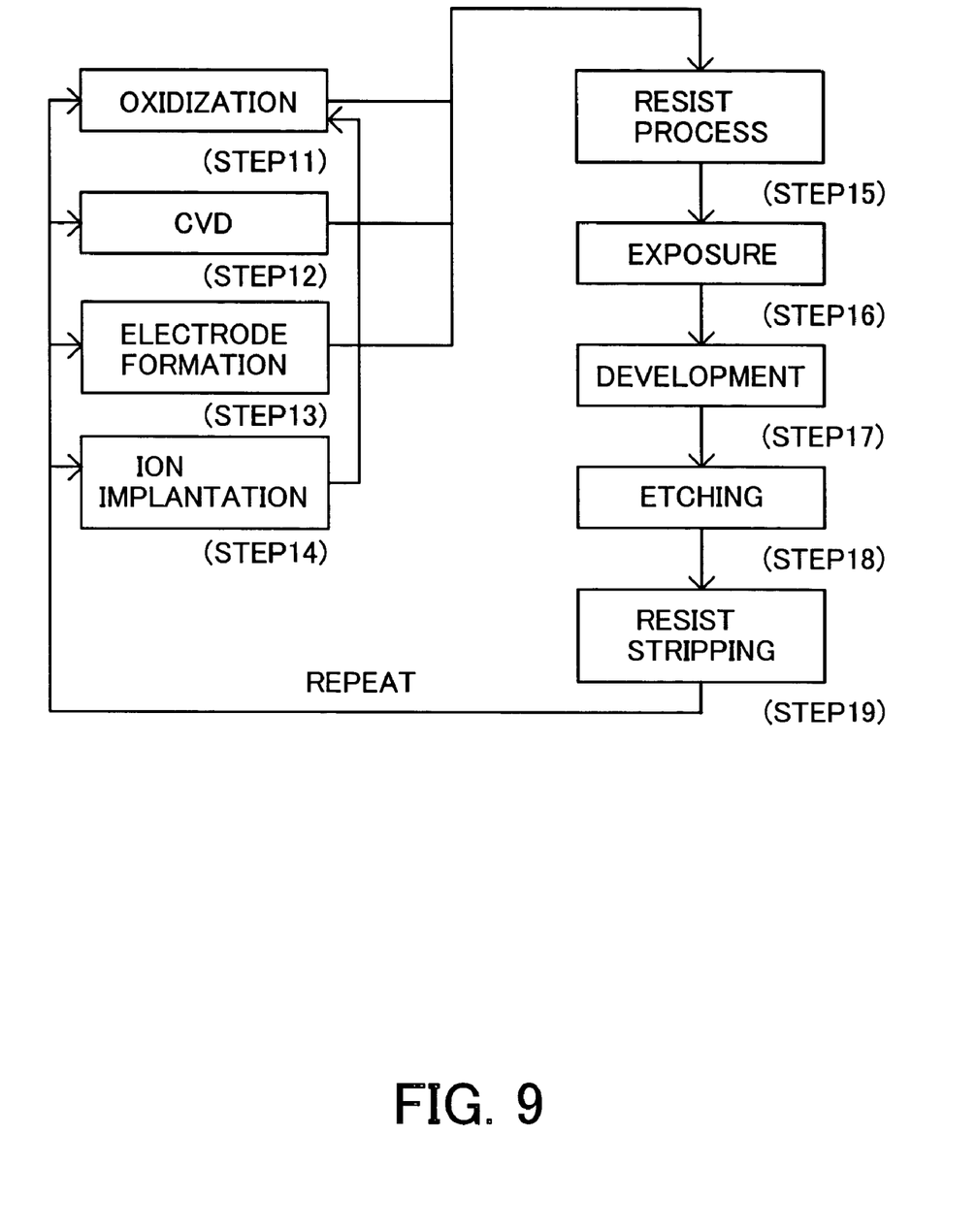
FIG. 9 is a detailed flowchart of a wafer process in step 4 in FIG. 8.

Referring to FIGS. 8 and 9, a description will now be given of an embodiment of a device fabricating method using the above exposure apparatus 500. FIG. 8 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 9 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 500 to transfer a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus 500, and the devices as finished goods also constitute one aspect of the present invention.

The above embodiment can directly cool the irradiation area irradiated to the light, and can avoid the temperature distribution (temperature gradient) of the optical element that causes the deterioration of the imaging performance. The above embodiment can provides the exposure apparatus and device fabrication method using such the effective cooling apparatus.

Further, the present invention is not limited to these preferred embodiments, and various variations and modifications may be made without departing from the scope of the present invention. For example, the inventive cooling apparatus is applicable to an optical element including a mask and a wafer, ultraviolet light with a wavelength of 200 nm or smaller, such as ArF excimer laser light and $F_2$ excimer laser light.

This application claims a foreign priority benefit based on Japanese Patent Applications No. 2004-257551, filed on Sep. 3, 2004, which is hereby incorporated by reference herein in its entirety as if fully set forth herein.

What is claimed is:

1. An apparatus for cooling an object, said apparatus comprising:
    a heat radiation member;
    a concave mirror configured to reflect heat radiation from a region of the object toward said heat radiation member; and
    a cooling mechanism configured to cool said heat radiation member,
    wherein said heat radiation member is arranged between said concave mirror and the object.

2. An apparatus according to claim 1, further comprising a vacuum chamber configured to accommodate said heat radiation member, said concave mirror and the object.

3. An apparatus according to claim 1, wherein a reflection surface of said concave mirror is one of a paraboloid and a spheroid.

4. An apparatus according to claim 3, wherein the object is provided at a focus of the reflection surface.

5. An apparatus according to claim 1, wherein a visual angle of said concave mirror from said heat radiation member is not less than 160°.

6. An apparatus according to claim 1, further comprising an adjustment mechanism configured to adjust temperature of said concave mirror.

7. An apparatus according to claim 1, wherein at least one of following conditions (i) and (ii) is satisfied, the condition (i) being that a surface of said heat radiation member facing said concave mirror has an emissivity not less than 0.6, the condition (ii) being that a surface of said heat radiation member facing the object has an emissivity not greater than 0.2.

8. An apparatus according to claim 1, further comprising a shield configured to shield heat radiation between a surface of said heat radiation member facing the object and the object.

9. An apparatus according to claim 1, wherein a reflection surface of said concave mirror has a reflectivity not less than 0.7.

10. An apparatus according to claim 1, further comprising a shutter configured to intercept heat radiation between said heat radiation member and the object.

11. An apparatus according to claim 1, further comprising:
    a second heat radiation member different from said heat radiation member and facing a second region of the object different from the region of the object; and
    a second cooling mechanism to cool said second heat radiation member.

12. An apparatus according to claim 1, further comprising an exposure system configured to expose a substrate to a pattern of radiant energy in a vacuum atmosphere.

13. An apparatus according to claim 12, wherein the object is one of an optical element configured to direct the radiant energy, the substrate, and a mask that includes a pattern corresponding to the pattern of radiant energy.

14. An apparatus according to claim 12, wherein the radiant energy is extreme ultraviolet light energy.

15. A method of manufacturing a device, said method comprising steps of:
   exposing a substrate to a pattern of radiant energy using an apparatus as defined in claim 12;
   developing the exposed substrate; and
   processing the developed substrate to manufacture the device.

16. An apparatus for cooling an object, said apparatus comprising:
   a heat radiation member;
   a concave mirror configured to reflect heat radiation from a region of the object toward said heat radiation member; and
   a cooling mechanism configured to cool said heat radiation member.

* * * * *